United States Patent
Yang et al.

(10) Patent No.: US 6,467,072 B1
(45) Date of Patent: Oct. 15, 2002

(54) METHOD OF PLACEMENT AND ROUTING FOR AN ARRAY DEVICE

(75) Inventors: Chun-Chih Yang, Taipei Hsien (TW); Yung-Chung Chang, Taichung Hsien (TW); Shu-Tzu Wang, Tainan Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/306,254

(22) Filed: May 6, 1999

(30) Foreign Application Priority Data

Nov. 20, 1998 (TW) .......................... 87119244

(51) Int. Cl.[7] .................. F06F 17/50; H03K 19/00; H03K 17/693
(52) U.S. Cl. .................. 716/16; 716/12; 716/14; 716/17
(58) Field of Search .................. 703/27; 716/5, 716/16, 18, 9, 2, 3, 12, 17, 14

(56) References Cited

U.S. PATENT DOCUMENTS

| | | | | |
|---|---|---|---|---|
| 5,384,710 A | * | 1/1995 | Lam et al. .................. | 716/12 |
| 5,402,358 A | * | 3/1995 | Smith et al. .................. | 716/9 |
| 5,461,576 A | * | 10/1995 | Tsay et al. .................. | 716/6 |
| 5,483,461 A | * | 1/1996 | Lee et al. .................. | 716/14 |
| 5,550,839 A | * | 8/1996 | Buch et al. .................. | 371/22.1 |
| 5,724,250 A | * | 3/1998 | Kerzman et al. .................. | 716/3 |
| 5,726,903 A | * | 3/1998 | Kerzman et al. .................. | 716/2 |
| 5,867,396 A | * | 2/1999 | Parlour .................. | 716/16 |
| 5,940,603 A | * | 8/1999 | Huang .................. | 716/5 |
| 5,946,219 A | * | 8/1999 | Mason et al. .................. | 716/16 |
| 5,949,690 A | * | 9/1999 | Lawman .................. | 716/6 |
| 5,963,454 A | * | 10/1999 | Dockser et al. .................. | 716/18 |
| 6,078,736 A | * | 6/2000 | Guccione .................. | 716/16 |
| 6,405,356 B1 | * | 6/2000 | Yang .................. | 716/10 |
| 6,134,516 A | * | 10/2000 | Wang et al. .................. | 703/27 |
| 6,145,117 A | * | 11/2000 | Eng .................. | 716/18 |
| 6,216,258 B1 | * | 4/2001 | Mohan et al. .................. | 716/17 |
| 6,249,901 B1 | * | 6/2001 | Yuan et al. .................. | 716/5 |
| 6,263,483 B1 | * | 7/2001 | Dupenloup .................. | 716/18 |
| 6,289,491 B1 | * | 9/2001 | Dupenloup .................. | 716/5 |
| 6,292,931 B1 | * | 9/2001 | Dupenloup .................. | 716/18 |
| 2001/0001881 A1 | * | 5/2001 | Mohan et al. .................. | 716/1 |
| 2001/0018759 A1 | * | 8/2001 | Andreev et al. .................. | 716/7 |

* cited by examiner

*Primary Examiner*—Vuthe Siek
*Assistant Examiner*—A. M. Thompson
(74) *Attorney, Agent, or Firm*—J.C. Patents

(57) ABSTRACT

The invention provides a method of placement and routing for an array device in an integrated circuit (IC). In the method, a schematic script file used to describe placement for the array device is created according to a netlist and an array structure specification. The schematic script file is loaded into an auto P&R tool. The auto P&R tool is executed for completely routing the array device. After routing, an RC extraction can be directly implemented. Thus, product development time is greatly shortened.

5 Claims, 5 Drawing Sheets

METHOD OF PLACEMENT AND ROUTING FOR AN ARRAY DEVICE

CROSS-REFERENCE TO RELATED APPLICATION

This application claims the priority benefit of Taiwan application serial no. 87119244, filed Nov. 20, 1998, the full disclosure of which is incorporated herein by reference.

BACKGROUND OF THE INVENTION

1. Field of the Invention

The invention relates to a method of placement and routing for an array device, and in particular to a method of placement and routing for an array device in which a schematic script file is created according to a circuit topology and a netlist corresponding to the array device, and then a routing program in coordination with the schematic script file is executed for automatic routing.

2. Description of the Related Art

Currently, great progress has been made in semiconductor technology. Any complicated circuit can be built in one single integrated circuit (IC) with an operating speed that is continuously increased. Due to an increase in IC complexity, feasibility testing methods for circuit designs is different from that for a conventional practical circuit connection. Current circuit designs are implemented with a computer-aided tool. For example, a circuit is designed by a circuit design program according to a specific specification, and then the designed circuit is tested for its own logic functions by a simulation program. After the logic functions of the designed circuit are determined to be exactly correct, a circuit placement and routing (P&R) is performed by a P&R tool so as to manufacture a real chip. Furthermore, it is necessary to take into consideration a time delay for a signal to transmit in the real circuit. Therefore, an RC value for each device must be extracted for implementing a time delay simulation, so that routing for the real circuit can meet the requirement of the time delay.

Even though the functions of current P&R tools are powerful, they do not perform well under some circumstances, such in an array device with a symmetrical structure. Generally, there are many kinds of array devices, such as a first in first out (FIFO) memory. An FIFO memory is used to store a queue of data or programs via the input terminals thereof. Then, the data or program can be read out in order via the output terminals of the FIFO memory. In order to ensure that the data can correctly flow between memory units in the FIFO memory, it is necessary to keep correct timing. FIG. 1 is a block circuit diagram showing a structure of an FIFO memory 100. As shown in FIG. 1, the FIFO memory 100 has a width of n-bit data $B_0$–$B_{n-1}$ and a depth of m orders. Each memory unit 110 can store one-bit data while each column of memory units 110 consisting of an order of memory can store n-bit data. Each order of memory is controlled by a control unit 120. In order to reduce the influence of a signal delay as much as possible, each control unit 120 is disposed in the center of each order of memory. The n-bit data $B_0$–$B_{n-1}$, are inputted to the first order of memory, and then are passed backward in order to the mth order of memory.

FIG. 2 is a block circuit diagram showing the memory unit 110 of FIG. 1. Referring to FIG. 2, the memory unit 110 includes a buffer 112 and a latch circuit 114. Obviously, data are input to the input terminal I of the memory unit 110. The data coming from the buffer 112 is latched in the latch circuit 114 with the control of a control terminal E. Then, the latched data can be read out from an output terminal O thereof.

As an example, the FIFO memory 100 is an array device with a width of 64 bits and a depth of 32 orders; it has a total of 64×32 regularly arranged memory units. Each memory unit 110 of an order of memory is controlled by a control signal which is input to a control terminal E to latch data output from a previous order of memory. Therefore, to correctly transmit the data in order among the orders of memories, the control signal must be absolutely precise. Furthermore, as the correct operation of the FIFO memory 100 is substantially determined by the time delay of the control signal.

Since the properties of the array device cannot be processed particularly by an auto P&R tool, placement and routing for the array device is completely implemented by manual labor. Additionally, results obtained from manual P&R are much better than that from automatic P&R by a P&R tool.

FIG. 3 is a flow chart showing a method of placement and routing for an array device according to the prior art. Referring to FIG. 3, in step 310, placement and routing for the array device is implemented by manual labor with a one-week working period per FIFO required.

In step 315, the manual placement-and-routing completed array device is considered a black box in a P&R tool.

In step 320, the P&R tool is executed to automatically complete placement and routing for an entire chip.

In step 325, a data file obtained from executing the P&R tool is transferred into an intermediate file, such as a GDS format file, with a 2 to 3-day working period required. Moreover, the transferring process is interrupted each time a P&R error occurs. Only after correcting the error can the transferring process restart from the beginning. In other words, it takes much more time to complete step 325.

In step 330, an RC extraction is performed according to the middle file thereby creating a standard delay format (SDF) file for a subsequent circuit simulation verification.

Furthermore, it is inconvenient to perform manual placement and routing by using an auto P&R tool, such as an XO P&R software. Therefore, in the prior method of placement and routing for an array device, placement and routing for the array device is completed by manual labor in coordination with another software, such as an OPUS tool. After that, the manual placement-and-routing completed array device is considered a black box in the P&R tool, followed by the execution of the auto P&R tool for complete placement and routing of an entire chip. Since the manual placement-and-routing completed array device is considered a black box, RC extraction cannot be directly implemented. Therefore, a data file obtained from executing the routing program must be transferred into an intermediate file before RC extraction. In addition approximately a one-week working period is required for manual P&R, and a 2 to 3-day working period is necessary for file transferring. As a result, the cycle time of chip manufacturing is seriously affected.

In short, the prior method of placement and routing for an array device has the following disadvantages:

1. In order to cooperate with the properties of an array device, much more time must be taken for manual placement and routing, resulting in an influence on product development.

2. The manual placement-and-routing completed array device is considered a black box in a P&R tool. After automatically routing the entire chip by executing the routing program, the obtained data file must be transferred into an intermediate file for subsequent RC extraction. Since file transferring takes much more time, product development time is greatly increased.

SUMMARY OF THE INVENTION

In view of the above, an object of the invention is to provide a method of placement and routing for an array device. In the method, a schematic script file is created according to a circuit topology and a netlist which are corresponding to the array device, and then a P&R tool in coordination with the schematic script file is executed for an automatic routing. Thus, product development time can be greatly shortened.

To achieve the above-stated object, the method of placement and routing for an array device according to the invention includes the following steps. First, a netlist and an array structure specification for describing the array device is provided. A schematic script file is created for describing placement for the array device according to the netlist and the array structure specification. The schematic script file is loaded into a P&R tool. The P&R tool is executed to automatically route the array device.

Furthermore, the schematic script file includes a blockage where the routing program is instructed to build routing only for the array device.

BRIEF DESCRIPTION OF THE DRAWINGS

The invention will become more fully understood from the detailed description given hereinbelow and the accompanying drawings which are given by way of illustration only, and thus do not limit the present invention, and wherein.

DETAILED DESCRIPTION OF THE PREFERRED EMBODIMENT

Figure 1:
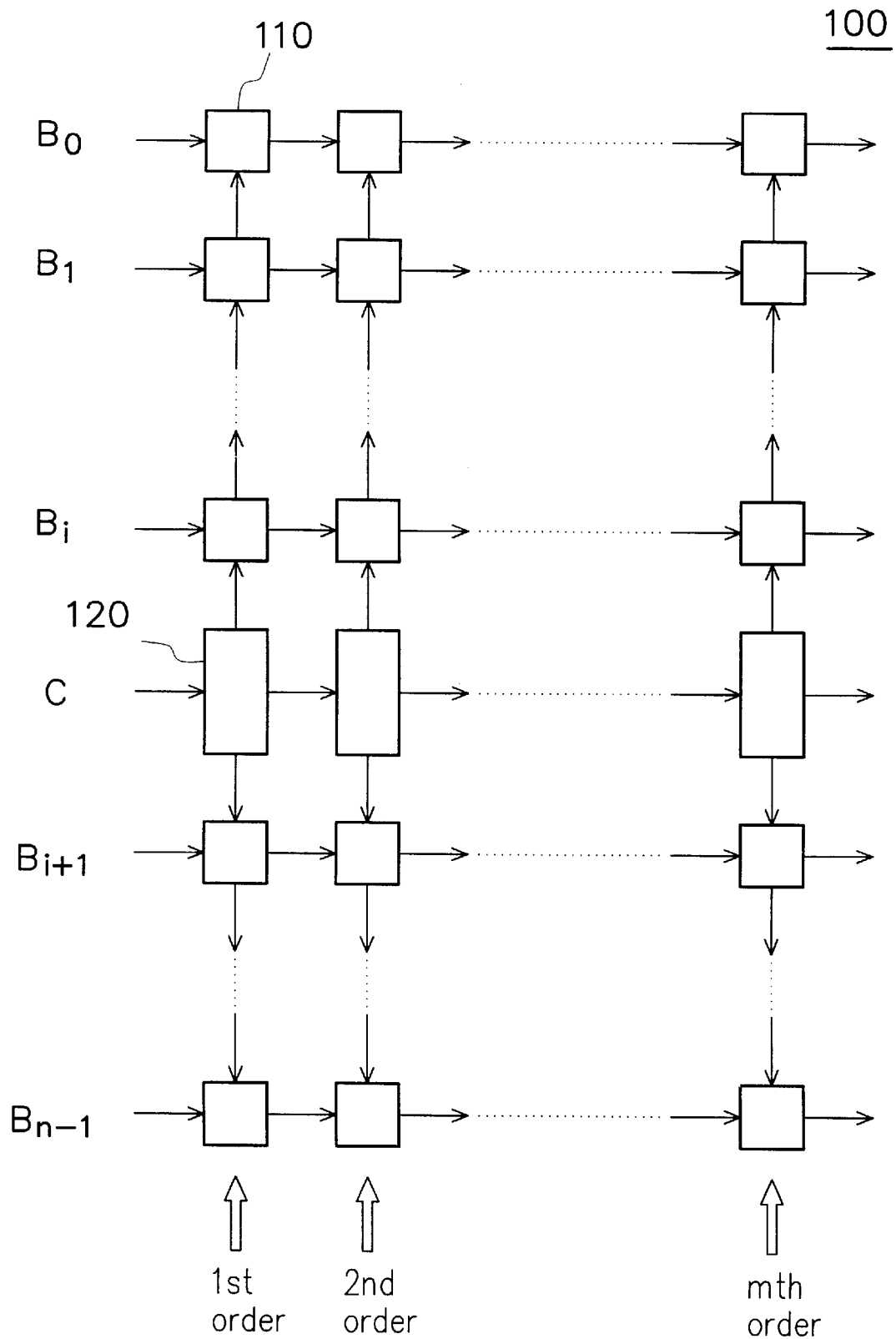
FIG. 1 is a block circuit diagram showing a conventional FIFO memory.
Figure 2:
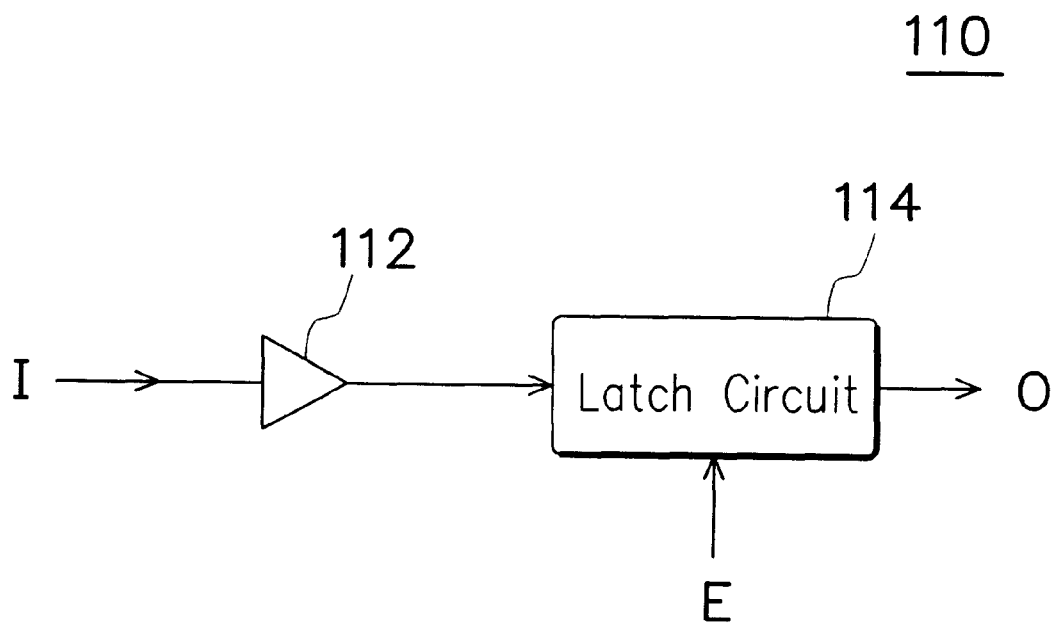
FIG. 2 is a block circuit diagram showing a memory unit of the conventional FIFO memory of FIG. 1.
Figure 3:
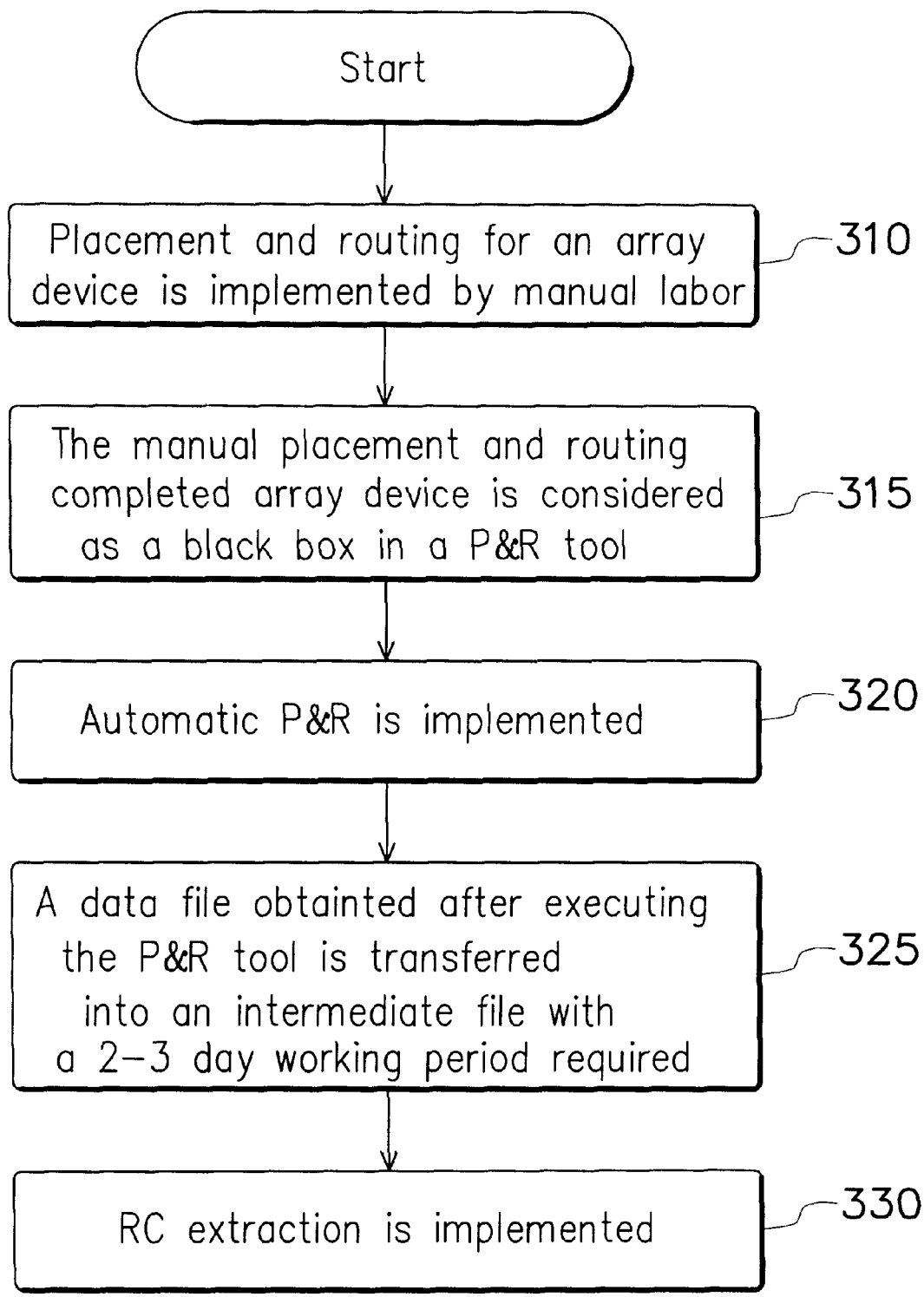
FIG. 3 is a flow chart showing a method of placement and routing for an array device according to the prior art.
Figure 4:
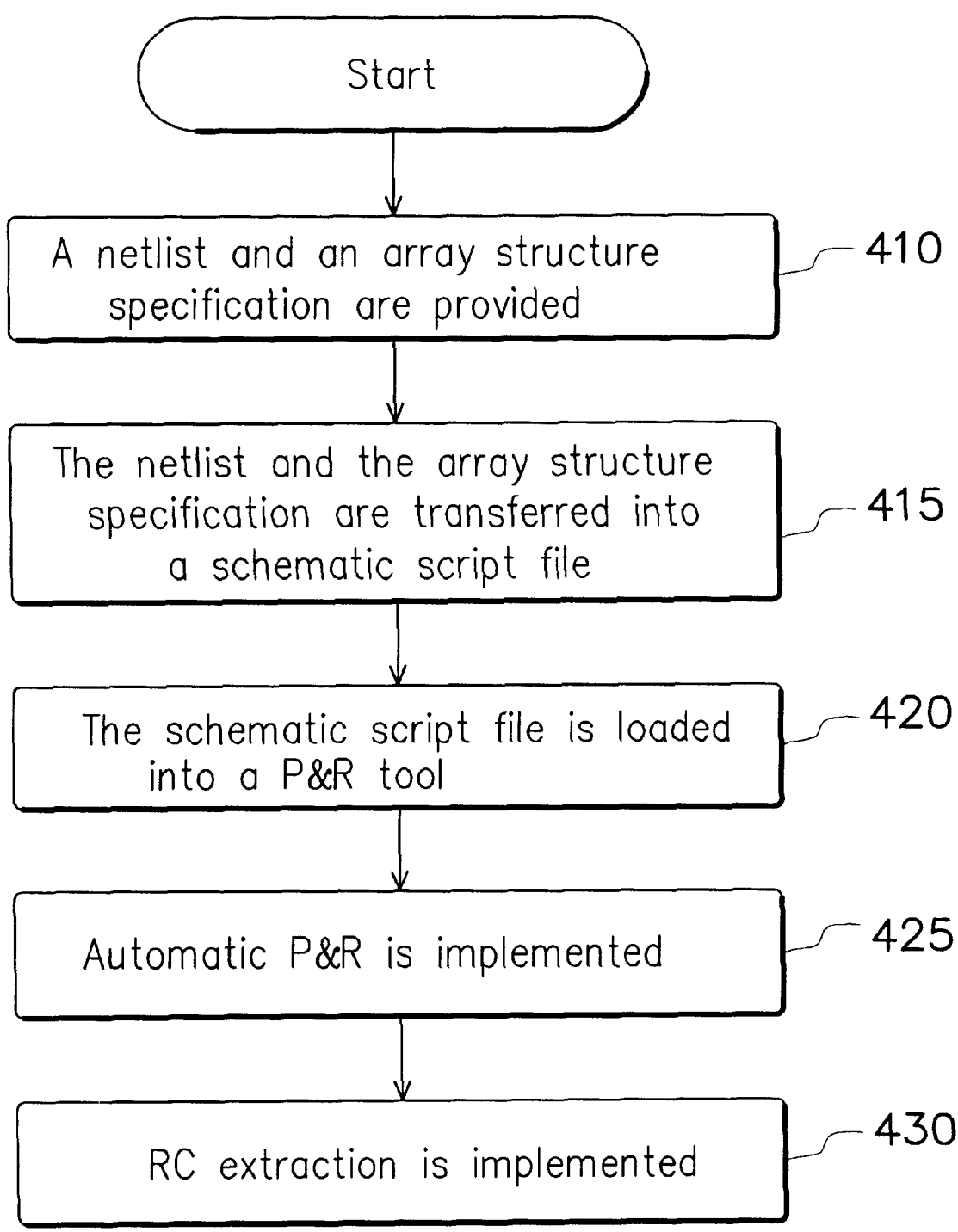
FIG. 4 is a flow chart showing a method of placement and routing for an array device according to a preferred embodiment of the invention.

FIG. 4 is a flow chart showing a method of placement and routing for an array device according to a preferred embodiment of the invention. The method of placement and routing for an array device includes the following steps.

First, in step 410, a netlist and an array structure specification are prepared according to the array device designed by engineers. The netlist shows the relationship of electrical connections among elements in the array device, and can be automatically created after completing the array device design by a circuit design tool. The array structure specification indicates the circuit topology of the array device. As an example, an FIFO memory is arranged as an array of memory units including n rows and m columns of memory units. Additionally, control units are disposed between ith row of memory units and (i+1)th row of memory units.

In step 415, the prepared netlist and array structure specification are transferred into a schematic script file which describes placement for the array device by a transferring program. The schematic script file is used for the placement of all elements in the array device, but not for routing among the elements. Routing for the array device will be subsequently automatically implemented by executing an auto P&R tool.

Since all elements in the array device are regularly arranged based on its own properties and structure specification, the routing for the array device can be optimized by subsequently executing the routing program according to the relative relationship among the elements. Moreover, to avoid routing for other elements not included in the array device interfering with that for the array device, it is specified in the schematic script file that the routing for other elements cannot passes through a certain range surrounding the array device.

Figure 5:
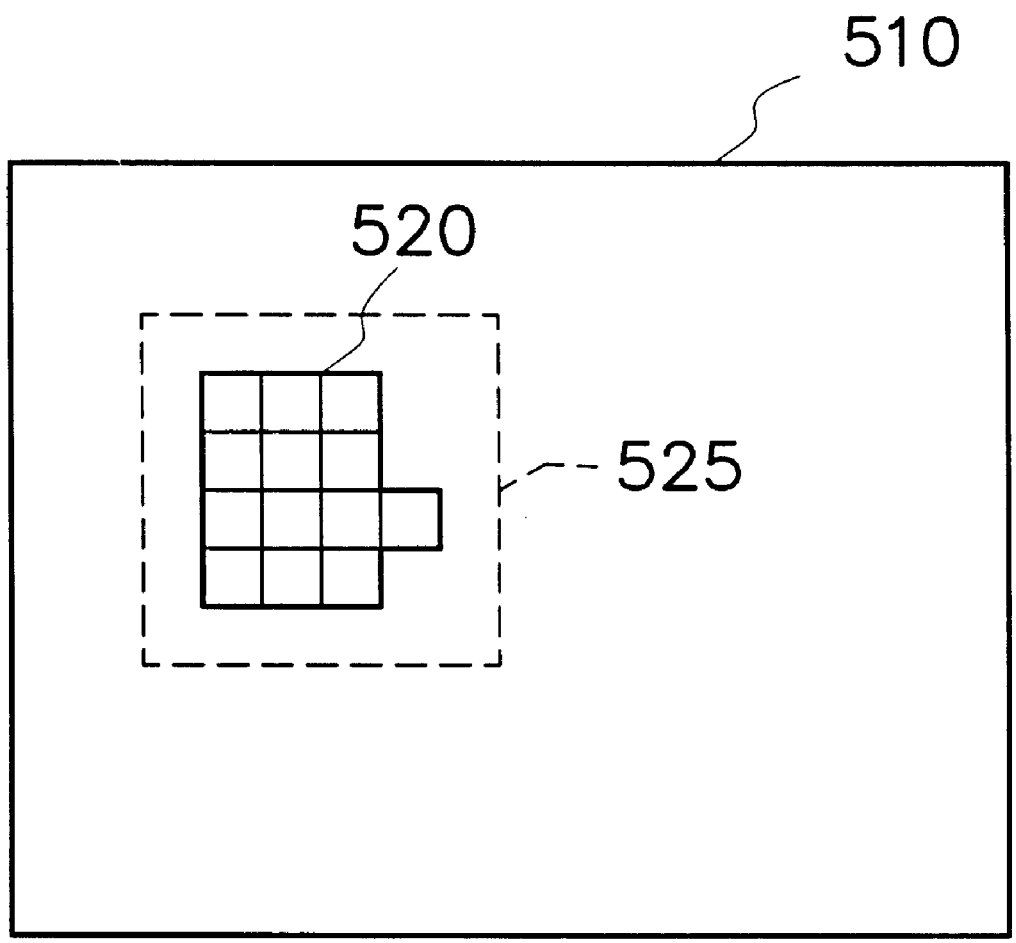
FIG. 5 is a schematic view showing a blockage surrounding an array device according to the invention.

FIG. 5 is a schematic view showing a blockage 525 surrounding an array device 520. Referring to FIG. 5, the array device 520 formed in an entire chip 510 is surrounded by the blockage 525. The blockage 525 is defined by a format specified by a routing program. Therefore, when the schematic script file is loaded into the routing program, not only can an element placement according to the schematic script file be accepted, but also the range of the blockage 525 can be defined, thereby making the routing of the array device 520 as perfect as possible. As a result, the designed array device can have a better timing characteristic.

In step 420, the schematic script file is loaded into a P&R tool to complete an element placement for the array device which, rather than being a black box, is accepted by the P&R tool. For this reason, each element of the array device can be well controlled, and routing can be automatically implemented according to the provided netlist.

In step 425, routing is completely implemented by executing the routing program. At the same time, placement and routing for other elements in an entire chip is implemented.

In step 430, after completing routing for the entire chip, RC extraction is implemented for a subsequent circuit simulation. Since the schematic script file is created by transferring the netlist and the array structure specification with the transferring program according to the P&R tool, the P&R tool can fully control all the elements of the array device after loading the schematic script file, wherein the schematic script file, rather than a black box, is accepted by the P&R tool. After completely routing the whole chip, less than half a day is all that is needed to implement RC extraction. Therefore, within a very short time after completing routing, a circuit simulation analysis can be instantly performed, resulting in a decrease of design time.

As described above, in the method of placement and routing for an array device, the array structure specification is defined according to the circuit topology of the array device, and the netlist of the array device is prepared. Furthermore, the schematic script file for the element placement for the array device is created by transferring the array structure specification and the netlist with a transferring program, and then loaded into the P&R tool. The P&R tool is executed for completely routing the entire chip including the array device. After routing, RC extraction can be directly implemented. Since the format of the schematic script file for describing the element placement for the array device is accepted by the routing program, the P&R tool can completely control all the elements of the array device after loading the schematic script file, and routing can be performed according to the netlist. Unlike the prior art, in which placement and routing for an array device is completed by manual labor and a data file obtained after executing a routing program must be transferred into an intermediate file before RC extraction, the method of placement and routing for an array device in accordance with the invention can greatly shorten product developing time by saving manual labor.

Compared to the prior art, the method of placement and routing for an array device of the invention has the following advantages.

1. A schematic script file for an element placement for an array device is created according to a circuit topology and a netlist thereof, and then loaded into a routing program for automatic routing. Therefore, time spent for manual routing as stated in the prior art is greatly saved.
2. The schematic script file has a format acceptable to the routing program. Automatic routing is implemented by executing the routing program after loading the schematic script file. Moreover, RC extraction can be directly implemented without transferring a data file into an intermediate file as stated in the prior art. That is, it is unnecessary to spend time for file transferring, such that product development time can be further shortened, and manufacturing cost is greatly reduced.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of placement and routing for an array device comprising the steps of:

providing a netlist and an array structure specification which describes an array device;

creating a schematic script file which describes placement for the array device according to the netlist and the array structure specification, wherein the schematic script file comprises a blockage where a routing program is instructed to build routing only for the array device;

loading the schematic script file into the routing program; and executing the routing program for completely routing the array device.

2. The method of placement and routing for an array device as defined in claim 1, wherein the array device is a first in first out (FIFO) memory.

3. A method of placement and routing for an array device, wherein the array device has a plurality of elements, the method comprising the steps of:

providing a netlist and an array structure specification, wherein the netlist describes the relationship of electrical connections among the elements, and the array structure specification describes an arrangement of the elements;

creating a schematic script file which describes placement for the elements according to the netlist and the array structure specification, wherein the schematic script file comprises a blockage where a routing program is instructed to build routing only for the array device;

loading the schematic script into the routing program; and executing the routing program for completely routing the elements.

4. The method of placement and routing for an array device as defined in claim 3, wherein the array device is a first in first out (FIFO) memory.

5. The method of placement and routing for an array device as defined in claim 3, wherein the elements comprises a plurality of memory units and control units.

* * * * *